(12) United States Patent
Liu et al.

(10) Patent No.: US 9,478,587 B1
(45) Date of Patent: Oct. 25, 2016

(54) MULTI-LAYER CIRCUIT BOARD FOR MOUNTING MULTI-COLOR LED CHIPS INTO A UNIFORM LIGHT EMITTER

(71) Applicant: DiCon Fiberoptics, Inc., Richmond, CA (US)

(72) Inventors: Yao-Ren Liu, Kaohsiung (TW); Ho-Shang Lee, El Sobrante, CA (US)

(73) Assignee: DiCon Fiberoptics Inc., Richmond, CA (US)

( * ) Notice: Subject to any disclaimer, the term of this patent is extended or adjusted under 35 U.S.C. 154(b) by 0 days.

(21) Appl. No.: 14/979,175

(22) Filed: Dec. 22, 2015

(51) Int. Cl.
*H01L 21/00* (2006.01)
*H01L 29/20* (2006.01)
*H01L 27/32* (2006.01)
*H01L 27/15* (2006.01)

(52) U.S. Cl.
CPC ......... *H01L 27/3218* (2013.01); *H01L 27/156* (2013.01)

(58) Field of Classification Search
CPC .................................................. H01L 27/3218
USPC ................................. 438/34, 28; 257/88–92
See application file for complete search history.

(56) References Cited

U.S. PATENT DOCUMENTS

| | | |
|---|---|---|
| 3,864,219 A | 2/1975 | Dosch et al. |
| 3,964,982 A | 6/1976 | Kim |
| 4,519,020 A | 5/1985 | Little |
| 4,739,456 A | 4/1988 | Little |
| 4,843,528 A | 6/1989 | Pearce-Harvey et al. |
| 4,936,957 A | 6/1990 | Dickey et al. |
| 5,012,609 A | 5/1991 | Ignatius et al. |
| 5,165,778 A | 11/1992 | Matthias et al. |
| 5,235,499 A | 8/1993 | Bertenshaw |
| 5,468,694 A | 11/1995 | Taguchi et al. |
| 5,482,614 A | 1/1996 | Kondo et al. |
| 5,687,062 A | 11/1997 | Larson |
| 5,715,040 A | 2/1998 | Iba |
| 5,925,228 A | 7/1999 | Panitz et al. |

(Continued)

FOREIGN PATENT DOCUMENTS

WO 2008058446 A1 5/2008

OTHER PUBLICATIONS

Li et al., "Hexagonal Pore Arrays with a 50-420 nm Interpore Distance Formed by Self-Organization in Anodic Alumina," Journal of Applied Physics, 84(11), Dec. 1, 1998, pp. 6023-6026.

(Continued)

*Primary Examiner* — Calvin Lee
(74) *Attorney, Agent, or Firm* — Davis Wright Tremaine LLP (57) ABSTRACT

An array structure for light emitting diodes (LEDs) uses a patterned metal layer buried beneath LED chips to electrically interconnect non-adjacent chips in series, such that each chip in the LED array can be adjacently surrounded by LED chips of different colors. Thus, when the emission from the LED array is projected to a spot in the far field, its color uniformity over the spot is enhanced. Methods are also described for fabricating the multi-layer circuit board for such an array. Top and bottom patterned metal layers are formed, separated by a patterned insulating layer, so that electrical connections may be made between the metal layers. This provides "vias" between the metal layers for creating "cross-under" electrical connections under the second insulation layer, such that spatially-separated LED chips can be interconnected into strings, while maintaining electrical isolation between LED chips of different colors.

47 Claims, 10 Drawing Sheets

(56) References Cited

U.S. PATENT DOCUMENTS

| | | | |
|---|---|---|---|
| 6,092,914 A | 7/2000 | Esakoff et al. | |
| 6,455,930 B1 | 9/2002 | Palanisamy et al. | |
| 6,466,881 B1 | 10/2002 | Shih et al. | |
| 6,504,301 B1 | 1/2003 | Lowery | |
| 6,554,450 B2 | 4/2003 | Fang et al. | |
| 6,659,622 B2 | 12/2003 | Katogi et al. | |
| 6,690,509 B2 | 2/2004 | Vodyanoy et al. | |
| 6,774,050 B2 | 8/2004 | Ahn et al. | |
| 6,809,347 B2 | 10/2004 | Tasch et al. | |
| 6,809,790 B2* | 10/2004 | Yamagishi | G02F 1/136277 257/549 |
| 6,860,619 B2 | 3/2005 | Swanson | |
| 6,866,401 B2 | 3/2005 | Sommers et al. | |
| 6,885,035 B2 | 4/2005 | Bhat et al. | |
| 6,921,182 B2 | 7/2005 | Anderson, Jr. et al. | |
| 7,140,751 B2 | 11/2006 | Lin | |
| 7,173,383 B2 | 2/2007 | Vornsand et al. | |
| 7,192,162 B2 | 3/2007 | Tanaka et al. | |
| 7,220,018 B2 | 5/2007 | Crabb et al. | |
| 7,261,438 B2 | 8/2007 | Alessio | |
| 7,295,379 B2 | 11/2007 | Tsai | |
| 7,543,952 B1 | 6/2009 | Chang | |
| 7,549,772 B2 | 6/2009 | Wang | |
| 7,670,030 B2 | 3/2010 | Klipstein | |
| 7,676,915 B2 | 3/2010 | Ter-Hovhannissian | |
| 7,722,211 B2 | 5/2010 | Marra et al. | |
| 7,771,088 B2 | 8/2010 | Chen | |
| 7,832,894 B2 | 11/2010 | Rudolph et al. | |
| 7,893,445 B2 | 2/2011 | van de Ven et al. | |
| 8,023,074 B2* | 9/2011 | Watanabe | G02B 6/0053 349/106 |
| 8,038,319 B2 | 10/2011 | Bailey | |
| 8,044,427 B2 | 10/2011 | Su et al. | |
| 8,047,684 B2 | 11/2011 | Chang | |
| 8,057,060 B2 | 11/2011 | Fredricks | |
| 8,508,127 B2 | 8/2013 | Negley et al. | |
| 8,523,385 B2 | 9/2013 | Lu et al. | |
| 8,568,009 B2 | 10/2013 | Chiang et al. | |
| 8,596,815 B2 | 12/2013 | Lee et al. | |
| 8,692,281 B2 | 4/2014 | Su et al. | |
| 8,740,663 B2 | 6/2014 | Kim et al. | |
| 9,133,990 B2 | 9/2015 | Lee et al. | |
| 2005/0152146 A1 | 7/2005 | Owen et al. | |
| 2005/0237747 A1 | 10/2005 | Shimizu et al. | |
| 2007/0058368 A1 | 3/2007 | Partee et al. | |
| 2007/0062032 A1 | 3/2007 | Ter-Hovhannissian | |
| 2007/0215895 A1 | 9/2007 | Amoh et al. | |
| 2007/0253196 A1 | 11/2007 | Ormiston | |
| 2007/0257335 A1 | 11/2007 | O'Brien | |
| 2008/0006837 A1 | 1/2008 | Park et al. | |
| 2008/0032473 A1 | 2/2008 | Bocek et al. | |
| 2008/0058446 A1 | 3/2008 | Guevara et al. | |
| 2008/0218995 A1 | 9/2008 | Gilkey et al. | |
| 2008/0239476 A1 | 10/2008 | Matz et al. | |
| 2009/0080184 A1 | 3/2009 | Kobilke | |
| 2009/0190363 A1 | 7/2009 | McDonnell et al. | |
| 2009/0201577 A1 | 8/2009 | LaPlante et al. | |
| 2009/0288340 A1 | 11/2009 | Hess | |
| 2009/0315062 A1 | 12/2009 | Su et al. | |
| 2010/0033970 A1 | 2/2010 | Jetter et al. | |
| 2010/0067224 A1 | 3/2010 | Wu | |
| 2010/0188018 A1 | 7/2010 | Salm | |
| 2011/0050126 A1 | 3/2011 | Wang et al. | |
| 2012/0044713 A1 | 2/2012 | Chiang et al. | |
| 2012/0176769 A1 | 7/2012 | Reimer et al. | |
| 2013/0277643 A1 | 10/2013 | Williamson et al. | |
| 2013/0314893 A1 | 11/2013 | Paquette | |
| 2013/0335989 A1 | 12/2013 | Sato et al. | |
| 2014/0027789 A1 | 1/2014 | Katona et al. | |
| 2014/0092362 A1 | 4/2014 | Narayanaswamy et al. | |
| 2015/0260351 A1* | 9/2015 | Hiramatsu | F21S 8/026 362/231 |

OTHER PUBLICATIONS

Sulka et al., "Synthesis of Well-Ordered Nanopores by Anodizing Aluminium Foils in Sulfuric Acid," Journal of the Electrochemical Society, 149(7), available electronically May 16, 2002, pp. D97-D103.

Austral Wright Metals, Aluminum 1100 Product Data Sheet, UNS A91100, 2 pages, published Jan. 2005, 2 pages.

Thermal Solutions, "Insulated Aluminum Substrates Thermal Solutions for Hi Brightness LED Applications" TT Electronics, Issue May 2006, 6 pages.

Koninklijke Philips Electronics N. V., "Intellectual Property & Standards, Licensing Programs, LED-based Luminairies and Retrofit Bulbs", Nov. 11, 2010; www.ip.philips.com/services, 2 pages.

Koninklijke PhilipsElectronics N. V., "Philips Color Kinetics Core LED Lighting Technologies", Nov. 11, 2010; www.colorkinetics.com/technologies/core, 2 pages.

* cited by examiner

MULTI-LAYER CIRCUIT BOARD FOR MOUNTING MULTI-COLOR LED CHIPS INTO A UNIFORM LIGHT EMITTER

BACKGROUND

The following relates generally to a light source consisting of one or more arrays of light emitting diodes (LEDs), incorporating multiple LED chips of different colors or wavelengths, and in particular to a light source that uses a multi-layer circuit board, in order to improve the color mixing, color rendering and color temperature control of the light source.

In order to provide light of a specific color, or white light of a specific color temperature, with high brightness, it is normally necessary to use multiple LEDs or LED chips of different colors or wavelengths, so that the combined light output of the multiple LEDs has the desired spectral characteristics. A high quality light spot created from a light source is characterized by its spatially uniform chromaticity, or color temperature when characterizing white light. Achieving a spatially uniform light spot has not been challenging to do with traditional light sources such as tungsten bulbs and HMI (hydrargyrum medium-arc iodide) lamps since it is easier to produce a uniform light spot from a uniform source rather than a non-uniform one. However, producing a uniform light spot is more of a challenge for modern light sources that rely on the mixing of light from multiple LED or LED chips, which typically require additional light shaping and/or mixing optics such as diffusers to achieve good color uniformity.

In order to have a uniform spot being projected to an object, from a light source comprising an array of LED chips of multiple colors or wavelengths, each LED chip should be surrounded by LED chips of different colors in a two-dimensional plane, with the LED chips kept as close together as possible. Put another way, the LED chips of multiple colors should be intermixed or interspersed within the LED array, to improve the uniformity of the combined light output of the LED array.

In the case of high-quality white light sources, such as are used in the fields of photography, video, cinematography, and architectural lighting, it is also necessary for the light source to have a high Color Rendering Index (CRI), as well as a well-controlled color temperature (CCT). In addition, the ability to provide tunable or adjustable color temperature (CCT) is highly desirable, with high CRI at all color temperature settings. These requirements and objectives impose restrictions on the selection of LED colors and wavelengths, and the quantities used of each type of LED chip used in the LED array.

For efficient driving of the LED chips of an LED array, it is desirable to connect multiple LED chips together to form one or more series strings, with each series string driven by a controlled current source. In order to provide adjustability or tunability of the combined light output of the LED array, it is necessary to independently drive different subsets of the LED chips used in the array, as separate LED strings. If the LED array comprises LED chips of multiple colors or wavelengths, typical practice would be to connect the LEDs of like color or wavelength into one or more independently-driven strings. This allows the relative brightness of each color to be independently adjusted.

The substrate for mounting multiple LED chips to form one or more LED arrays must provide for electrical connectivity between the LED chips, or various subsets of the LED chips. In addition, electrical isolation or insulation must be provided between the different subsets of LED chips, and also to allow LED chips to be connected in series strings. The substrate must also provide good thermal conductivity, to efficiently transfer heat away from the LED chips. This is extremely important in the case of LED arrays that use large numbers of LED chips, packed closely together to provide an intense, high-brightness light source. Conventional epoxy-glass printed circuit boards (PCBs) and even ceramic substrates are not suitable because of poor thermal conductivity. A substrate having offering both good electrical conduction and insulation where desired, as well as good thermal conductivity, is highly preferred. Metal or semiconductor wafers with an electrically-insulating layer built on the top of the wafer, represent a good choice as the basis of a mounting substrate for LED arrays.

In an LED array comprising LED chips of multiple colors, with independent control of the multiple colors, the electrical connections of the LED chips into strings is made easier by clustering LED chips of like color. However, as stated above, this leads to poor color mixing, and poor spatial uniformity of the spot beam produced by the LED array light source. Color mixing and uniformity are both improved by spatially intermixing the LED chips of differing colors. In order to achieve good color mixing and uniformity, the LED array's mounting substrate should support the electrical connection of LED chips that are not adjacent to each other, and whose locations on the substrate may be fairly widely separated.

SUMMARY

According to one set of aspects, an array of light emitting diodes (LEDs) includes a plurality of LEDs, each having first and second terminals and being mounted over a substrate having an insulating surface, wherein the plurality of LEDs includes a first set of one or more LEDs and a second set of one or more LEDs. The first and second sets of LEDs are distinct and are interspersed in a linear arrangement along the substrate. A first patterned conductive layer is formed over the substrate and a second patterned conductive layer having a plurality of separated portions is formed at least partially over the first patterned conductive layer. Each of the plurality of LEDs is mounted over or adjacent to a corresponding portion of the second patterned conductive layer with a first terminal connected to it. An intermediate insulating layer is formed between the first and second patterned conductive layers. When a pair of adjacent LEDs in the linear arrangement are from different ones of the first and second sets, a second terminal of a first of the pair is connected to the first patterned conductive layer under the second of the pair; and the first patterned conductive layer under the first of the pair is connected to the second conductive layer under the second of the pair, where the first of the pair is the one furthest in a first direction along the linear arrangement.

In other aspects, an array of light emitting diodes (LEDs) includes a circuit board and a plurality of LEDs. The circuit board includes a substrate having an insulating surface, and one or more first patterned conductive layers, formed over the insulating surface of the substrate. The circuit board further includes an upper patterned conductive layer having a plurality of separated portions arranged in a linear arrangement over the substrate, each formed at least partially over a part of one or more of the first patterned conductive layers. One or more intermediate insulating layers are formed between the first and upper patterned conductive layers, so that the first conductive layers are isolated from one another and from the upper conductive layer. The plurality of LEDs includes multiple sets of one or more LEDs. Each of the LEDs has first and second terminals and are each mounted over or adjacent to a corresponding one of the separated portions of the upper patterned conductive layer with a first terminal connected to it, such that the sets of LEDs are interspersed along the linear arrangement. The second terminals of each of the LEDs are connected to one of the patterned conductive layers such that the LEDs of each set are connected in series through the one or more first patterned conductive layers when passing under or adjacent to LEDs of the other sets that are connected to the corresponding one of the separated portions of the upper patterned conductive layer in the linear arrangement.

Further aspects present a method that includes the forming of a circuit board. A first conductive layer is formed over an insulating surface of a substrate, the first conductive layer having a plurality of separated sections in a linear arrangement. An intermediate insulating layer is formed over the first conductive layer such that the sections of the first conductive layer have a portion at either end along the linear arrangement that is left uncovered by the intermediate insulating layer. A second conductive layer is formed over the first insulating layer, the second conductive layer having a plurality of separated sections each formed over a section of the first conductive layer and separated from them by the intermediate insulating layer. When a pair of sections of the second conductive layer adjacent in the linear arrangement are formed over different sections of the first conductive layer, the first of the pair is formed to connect to the uncovered portion of the first conductive layer under the second of the pair, where the first of the pair is the one furthest in a first direction along linear arrangement.

Additional aspects present a method that includes the forming of a circuit board. One or more first patterned conductive layers is formed over an insulating surface of a substrate and an upper patterned conductive layer having a plurality of separated portions in a linear arrangement is formed over the substrate, where separated portions is each formed at least partially over a part of one or more of the first patterned conductive layers. One or more intermediate insulating layers is formed between the first and upper patterned conductive layers, whereby the first conductive layers are isolated from one another and from the upper conductive layer. The patterned layers are formed to provide a plurality of independent current paths whereby a corresponding plurality of distinct sets of one or more devices are connectable in series for each set, with the sets of devices interspersed along the linear arrangement, when a first terminal of each device is connected to a corresponding one of the separated portions of the upper patterned conductive layer and a second terminal of each device is connected to one of the patterned conductive layers. The devices of each set are connected in series through the one or more first patterned conductive layers when passing under or adjacent to devices of the other sets that are connected to the corresponding one of the separated portions of the upper patterned conductive layer in the linear arrangement.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

The following describes multi-layer circuit board structures that are suitable for mounting multi-color LED chips to form a uniform light emitter. An exemplary structure includes an electrical insulation layer that is grown (thermally or by deposition) on the top of a thermally conductive wafer, made of a material such as metal, semiconductor or electrical insulator. A bottom electrically conducting layer is patterned on top of this first insulation layer and is used to interconnect LED chips from beneath, hopping across adjacent or neighboring chips such that a particular color of LED chips can be interconnected as a string for inputting electrical current, with electrical isolation between LED chips that are not part of the intended LED string.

An electrical insulation layer is grown between the bottom patterned metal layer and a top patterned metal layer.

The top metal layer is used for die-bonding to the LED chips. The second insulating layer is also patterned, so that electrical connections may be made between the top patterned metal layer and the bottom metal layer. The "vias" thus formed between the top and bottom patterned metal layers provide a mechanism for creating "cross-under" electrical connections under the second insulation layer, such that spatially-separated LED chips can be interconnected into strings, while maintaining electrical isolation between LED chips of different colors, that are part of other, electrically-separate string. Alternate embodiments can use more than two patterned metal layers and more than two insulation layers.

Methods are also described for fabricating the multi-layer circuit board. From a manufacturing point of view, a possible technical difficulty lies in growing the second insulation layer such that it will prevent electrical breakdown between the top and bottom patterned metal conduction layers. The voltage difference between the two metal conduction layers can be as high as 50 V, and possibly higher. The second insulation layer should have low porosity (i.e., a high packing density), and must be of sufficient thickness. Any sharp morphology (e.g. sharp "edges") on the second insulating layer may cause electrical arcing.

The examples presented here utilize a patterned metal layer that is buried beneath LED chips to electrically interconnect non-adjacent chips in series, such that each chip in the LED array is adjacently surrounded by LED chips of different colors or wavelengths. Thus, when the emission from the LED array is projected to a spot in the far field, its color uniformity over the spot is dramatically enhanced.

Figure 1A:
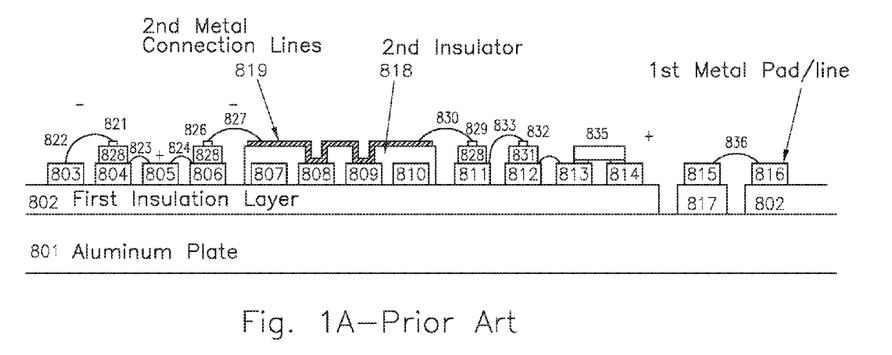
FIG. 1A illustrates an example of a prior art LED array having electrical interconnection on the top of the LED's layer.

FIG. 1A, excerpted from U.S. Pat. No. 8,692,281 and described there in more detail, illustrates prior art LED arrays having electrical interconnections that are made solely on the top surface of the submount, or mounting substrate, of the LED array. The electrical traces of this top metal layer that are used to interconnect the LED chips therefore take up space that could otherwise be used for mounting LED chips. This reduces the LED occupancy density such that emission intensity is reduced as well. Furthermore, the substrate 801 of this prior art is limited to aluminum plate.

Figure 1B:
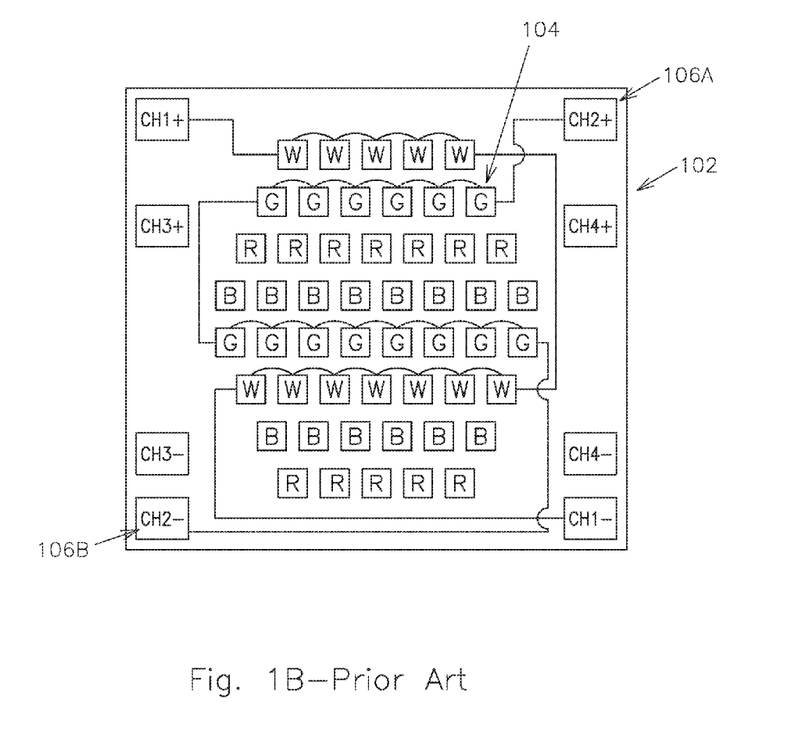
FIG. 1B illustrates the configuration of the LED chips of a prior art LED array on a mounting substrate, in which each LED chip is located adjacently to at least one other LED chip of the same color, so that LED chips of the same color can be easily connected into series strings.

FIG. 1B illustrates a prior art LED array, in which LED chips are configured over a mounting substrate 102. The letter labels on each of the LED chips indicate the LED's color (for example, White, Green, Red, and Blue). LED chips with similar or specified emission spectra are electrically connected in series as a string. In this way, LED chips of a particular color or spectrum can be controlled as a single entity, by varying the electrical current through the string to control its light emission intensity. For example, multiple green chips 104 are connected in series to two electrical terminals, 106A and 106B, for inputting current, as indicated by the dashed lines. Similarly, the solid lines indicate the interconnection of multiple white LED chips. The same interconnection description also applies to the red and blue LED chips, as shown in FIG. 1B. The limitations of the single layer of metallic paths in the prior art means that the LED chips must be configured such that chips of similar color must be adjacent to each other. Each LED chip shown in FIG. 1B is adjacent to at least one other chip in the array that is emitting similar emission spectrum (or is of the same color), and is also part of the same LED string. This creates color non-uniformity in the light spot of the illuminator. In addition to U.S. Pat. No. 8,692,281, more detail on LED arrays is presented in U.S. Pat. No. 9,133,990.

Figure 2:
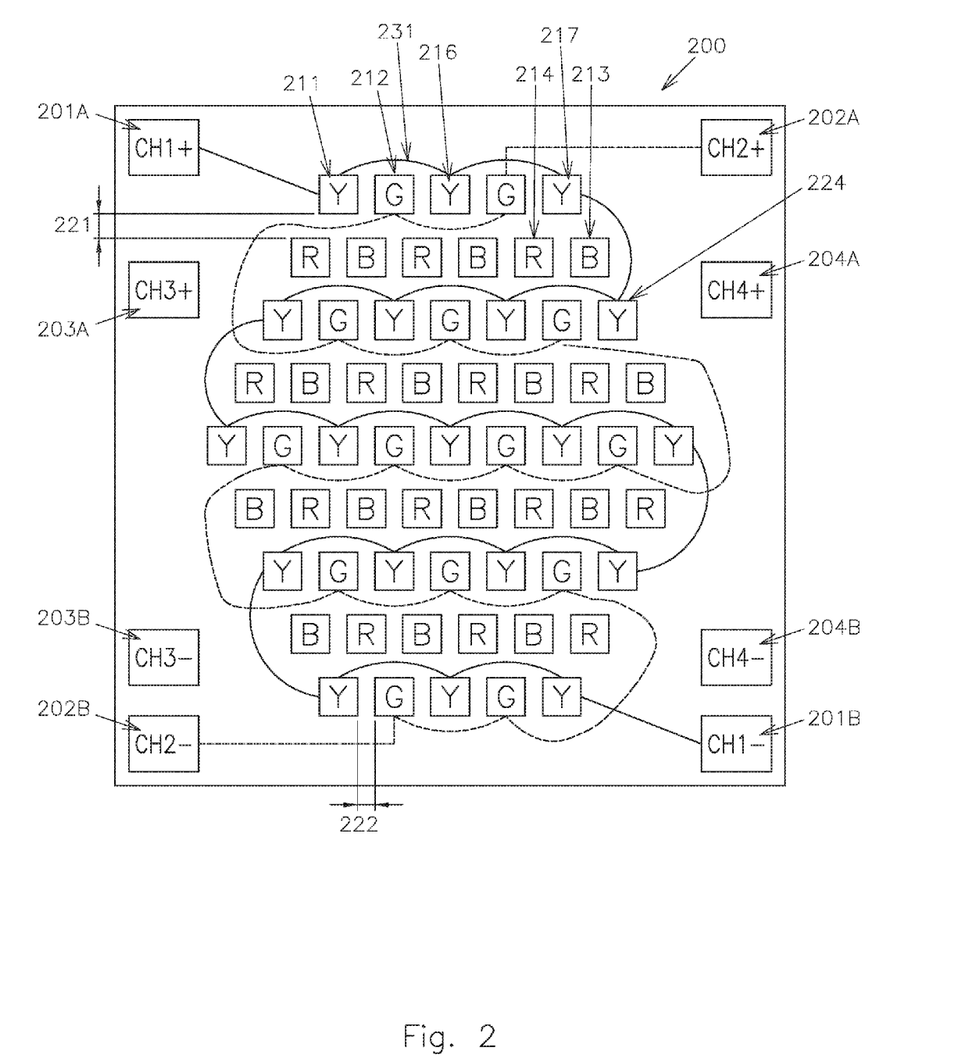
FIG. 2 illustrates one example of a desired LED chip configuration, in which every LED chip is adjacently surrounded by differently colored LED chips, for improved color mixing and uniformity.

FIG. 2 illustrates a more desired LED chip configuration, in which every LED chip is adjacently surrounded by different colored LEDs. Red 214, Yellow 211, Green 212, and Blue 213 LED chips are used in FIG. 2 to illustrate the spatial color mixing. LED chips that have phosphors applied, to alter their emission spectrum or color, are treated as LED chips of a particular color, and the use of LED chips with applied phosphors is within the scope of the present discussion. The closer the different LED colors are grouped spatially together, the better the color uniformity is, over a projected light spot. Ideally, it is desirable that the LED chips are as small as possible, and that any chip of a particular color is surrounded by all of the other colors used in the LED array, arranged to be as close as possible. Ideally, the distance between LED chips of the same color should be as uniform as possible, to avoid localized concentrations of the different colors. As an example, in FIG. 2, the first yellow chip Y 211 bypasses the green chip G 212 (using the lower metallic layer, passing underneath G 212) to electrically connect the second yellow chip Y 216, as indicated by the solid line 231, with additional electrical connections made to the third yellow chip Y 217, then the forth yellow chip Y 224, and so on. The resulting string of non-adjacent yellow LED chips is then connected to terminals CH1+ and CH1− (201A and 201B), to accept electrical current. Similar connections are made for the other three colors, green, red, and blue, to form separately-controllable strings of non-adjacent LED chips. As the number of strings increase, the total number of LED chips can easily exceed 200. Although FIG. 2 illustrates an arraignment in which the interconnecting of LEDs in the array is usually done as horizontal (as shown) or vertical lines of chips, the lines can be arranged differently than just as row or columns. For example, the lines might be "diagonal" lines, where the strings of interconnected chips would be rotated by 45 degrees, for example.

Additionally, the spacing between chips, as indicated by 221 and 222, ought to be as small as possible for better color uniformity and high light intensity, for a light spot in the far field. It is desirable that the spacing is less than 20 percent of the chip size (i.e., a chip spacing of 0.2 mm, for typical LED chips that are 1 mm×1 mm in size). Thus, it is preferable to route the electrical interconnections, which need to carry current up to 1,000 mA, such that they run beneath the LED chips, to reduce the spacing between chips. The exemplary embodiments presented here illustrate the use of three dimensional or multi-layer wiring/interconnect structures to serve this purpose.

FIGS. 3A through 11C illustrate one example for the design and fabrication processes of multi-color LED arrays mounted on a multi-layer substrate.

Figure 3A:
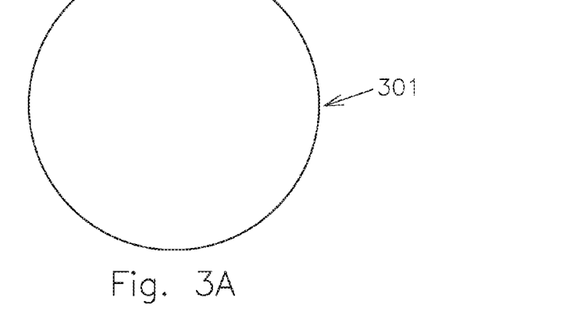
FIGS. 3A and 3B shows a bare wafer (either metal or semiconductor), and a wafer upon which a first electrical insulation layer has been grown on at least one side of the wafer, respectively.
Figure 3B:
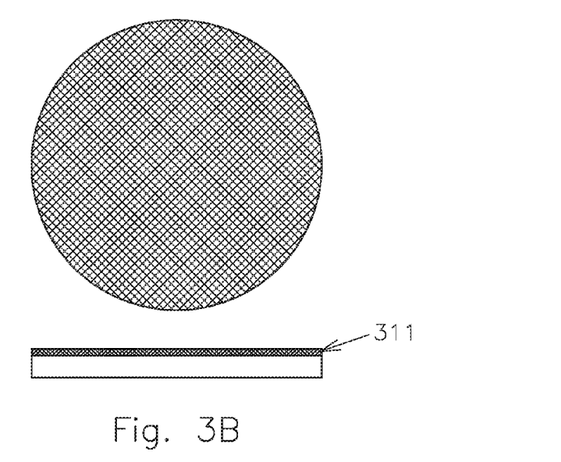

FIG. 3A shows a substrate wafer 301, made of either a metal such as aluminum or copper, or a semiconductor material such as silicon, or an electrically insulating material with fairly good thermal conductivity such as Aluminum Nitride (AlN), Sapphire, glass or various oxides. At least one of the two sides of the wafer has been finely polished to suppress its surface roughness, within a few micrometers. Any scratches, roughness, or morphology of the initial wafer surface will result in even surface roughness or other defects, as the following layers are deposited on top. Surface protrusions may form, that can cause electrical breakdown of the insulation layers between adjacent electrical conduction layers. The shape of the wafer can be circular, rectangular, or any other shape. The dimensions of the wafer may range from a few inches to more than ten inches. In cases where the substrate is a semiconductor material such as silicon, the first insulation layer 311, as shown in FIG. 3B, can be either thermally grown oxide on at least one side of the wafer 301, or it can be added by physical deposition of an oxide material, or a combination of multiple oxides such as silicon dioxide, niobium oxide, or titanium oxide, chosen for their electrical insulation properties, mechanical strength, and adhesion to the wafer 301. If the substrate wafer 301 is metal, such as aluminum, then an anodizing process, or film deposition of oxides, can be applied for growing the electrical insulation layer 311. The thickness of this first insulation layer ranges from a few micrometers, to a few tens of micrometers. In cases where the substrate is an electrically insulating material, the step of growing an insulation layer can be eliminated, and the wafer itself can be treated as the first insulation layer.

Figure 4:
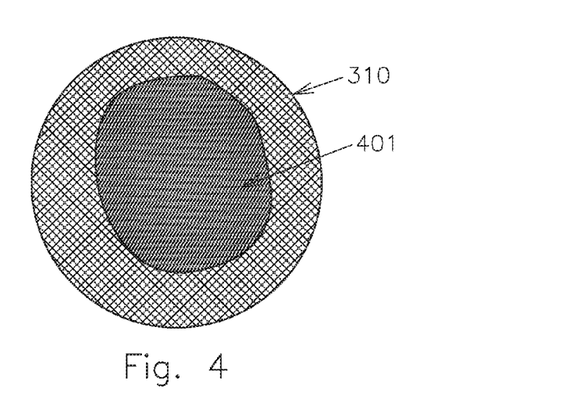
FIG. 4 illustrates the dispensing of photoresist on the wafer, prior to the spinning of the wafer to disperse the photoresist over the entire top surface of the wafer.

Photo-resist 401 is then dispensed onto the wafer 310 as illustrated in FIG. 4. The wafer 310 is then spun in a spinning machine to spread the photo-resist 401 uniformly over the wafer surface. The full wafer is then baked in oven to dry the photo-resist 401.

Figure 5A:
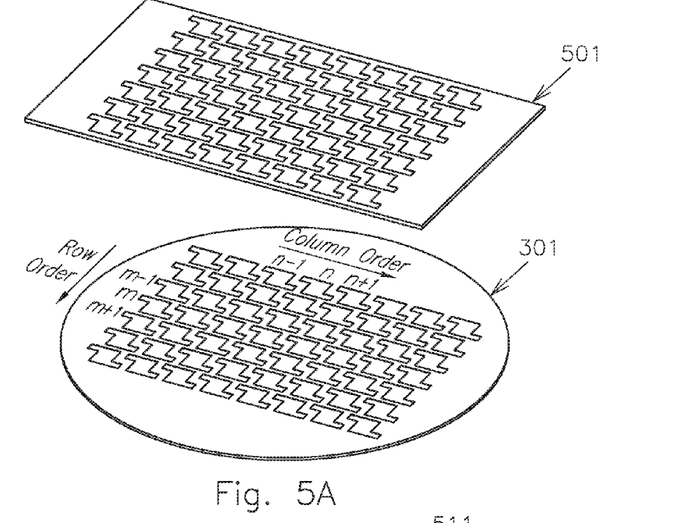
FIG. 5A illustrates a photolithographic process being done on the photoresist-coated wafer.
Figure 5B:
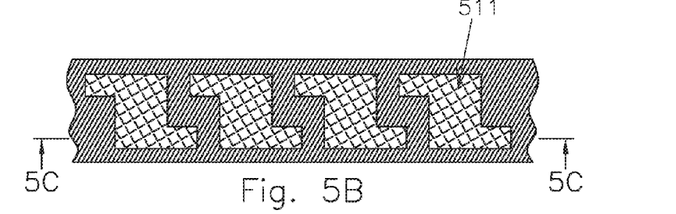
FIGS. 5B and 5C show the top and cross-section views of the photoresist pattern before development of the photoresist.
Figure 5C:
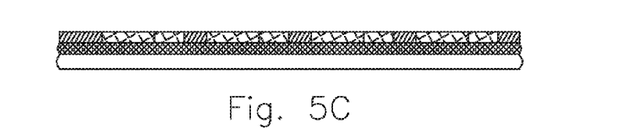
Figure 5D:
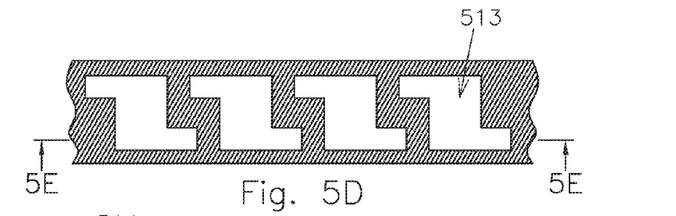
FIGS. 5D and 5E show the top and cross-section views of the photoresist pattern after development of the photoresist, and removal of exposed photoresist.
Figure 5E:
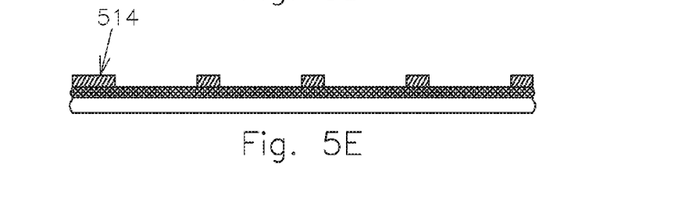

As shown in FIG. 5A, UV light passes through a photo-mask 501 using standard photolithography practices, to print or expose a desired pattern to the photo-resist 401. This step is a prelude to the creation of a first patterned metal layer onto the first insulation layer 311. In FIG. 5B, representing a portion of the top view of the wafer, the shaded area 511 is UV-exposed photo-resist. FIG. 5C is a cross-section view cutting through Line 5C-5C in FIG. 5B. The UV-exposed wafer is then immersed in liquid solution to remove the undesired photo-resist. In FIG. 5D, the area indicated by 513 has had the photo-resist removed. In the cross-section view of FIG. 5E, the remaining photo-resist is indicated as item 514. FIG. 5A illustrates how identical or repeating patterns are produced in row and column. The position of each repeating pattern is numbered by the notation convention of a mathematical matrix, namely (M, N). Thus, FIGS. 5B through 5E are representative of part of a row.

Figure 6A:
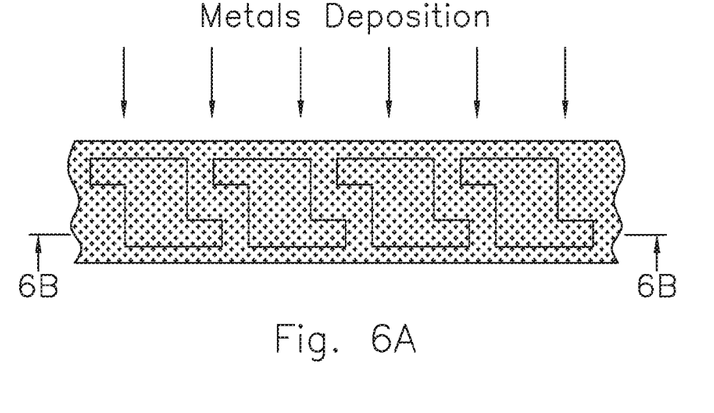
FIGS. 6A through 6C illustrate the first patterned metal layer being deposited and its lift-off process.
Figure 6B:
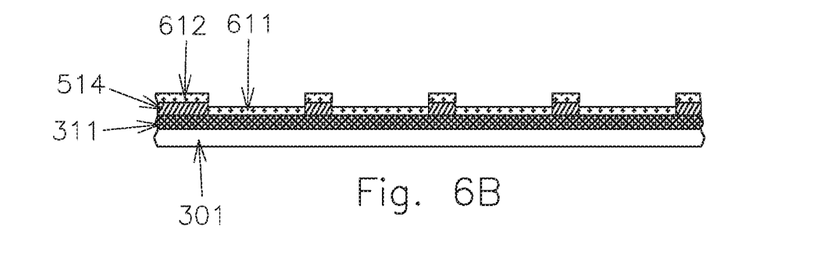
Figure 6C:
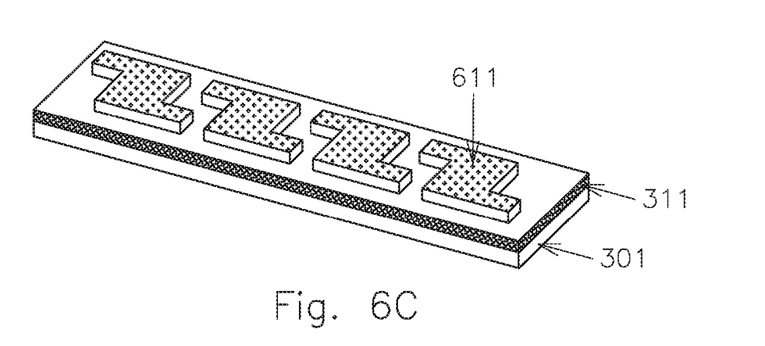

FIGS. 6A and 6B illustrates the deposition of one or multiple metals onto the top of the wafer. The metal chosen for the first deposition, such as titanium, should provide strong adhesion to the first insulation layer 311. Subsequent depositions are then made, using metals with excellent electrical conduction properties, such as gold and aluminum. FIG. 6B is the cross-section view of FIG. 6A. Portions of the metal layer 611 physically touch and adhere to the first insulation layer 311, while other portions of the metal layer 612 are deposited on top of the remaining photo-resist 514. The metal that is on top of the remaining photo-resist is then lifted off the wafer, as the photo-resist 514 is removed by a solvent. FIG. 6C shows a perspective view of the first patterned metal layer 611, adhering to the top of the first electrical insulation layer 311. The thickness of the first metal layer ranges from a few micrometers to a few tens of micrometers. Although patterned layer 611 and other patterned layers, such as layer 906 introduced below, are metal in the exemplary embodiments, in alternate embodiments one or more of these can formed be of other conductive materials, such as ITO (Indium Tin Oxide), for example.

Figure 7A:
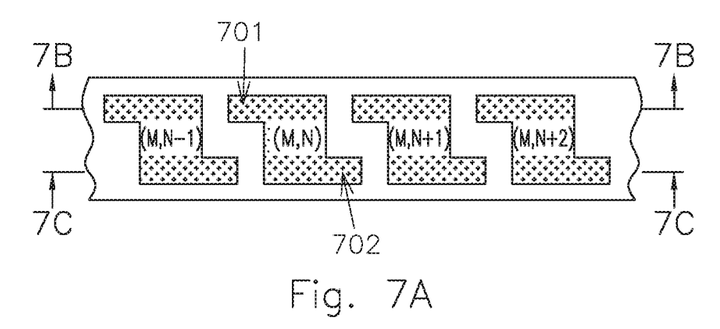
FIGS. 7A through 7C show the top and cross-section views of FIG. 6C.
Figure 7B:
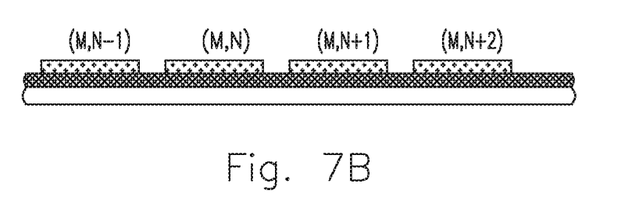
Figure 7C:
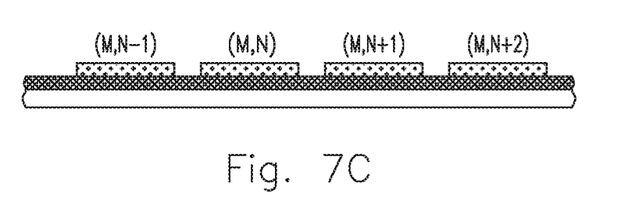

FIG. 7A is the top view of FIG. 6C. And FIGS. 7B and 7C are the cross-sections cutting through lines 7B-7B line and 7C-7C, respectively. Referring to FIG. 7A, extended arm 701 from position (M, N) of the first patterned metal layer 611 is intended to receive current coming from the metal pattern that will be located at position (M, N−1) in the second patterned metal layer, once it has been deposited (as described below). A metal bonding wire will then used to connect from extended arm 702 to the top of the LED chip that will be located at position (M, N+1). The net result is that current will flow beneath the position (M, N), from the bottom side of the LED chip located at (M, N−1) to the top side of the LED chip located at (M, N+1). In FIGS. 5A through 5E, FIGS. 6A through 6C and FIGS. 7A through 7C, a single shape of metal connection stripe is translationally invariant (i.e., the same shape is repeated) over the whole wafer surface, as a simple example to illustrate the idea. Other shapes of interconnect stripes are also applicable, to connect an LED chip positioned at (M, N) to another LED chip positioned at (M+P, N+Q), P and Q are integer. All variations of the metal interconnection stripes that are used to electrically connect the LED chips are within the scope of the present discussion.

Figure 8A:
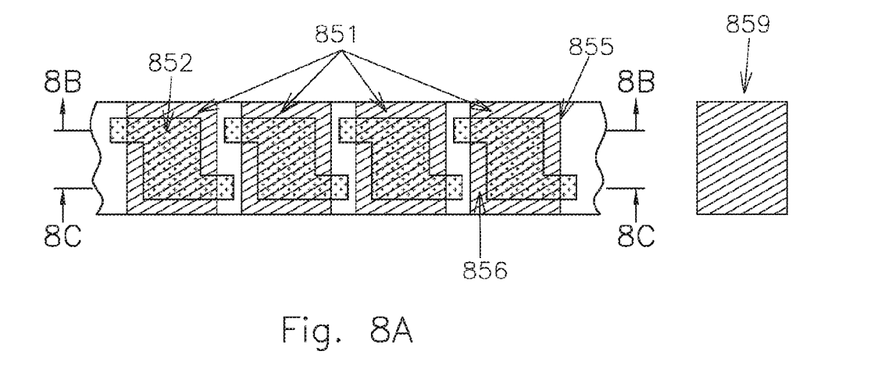
FIGS. 8A through 8C show the top and cross-section views, respectively, of the second patterned electrical insulation layer being deposited on the top of FIG. 6C.
Figure 8B:
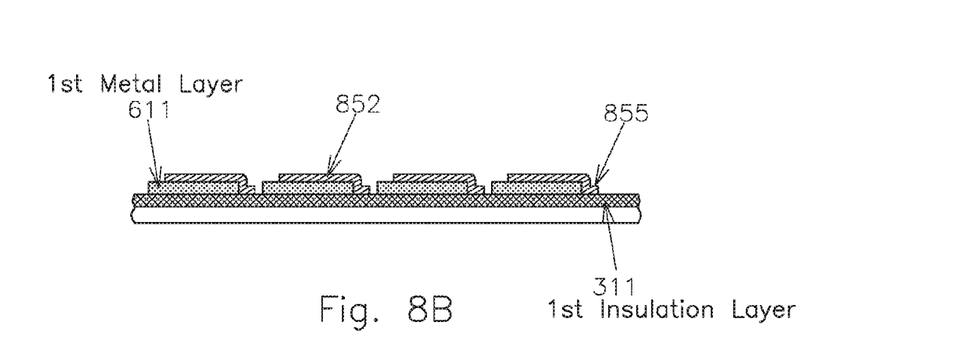
Figure 8C:
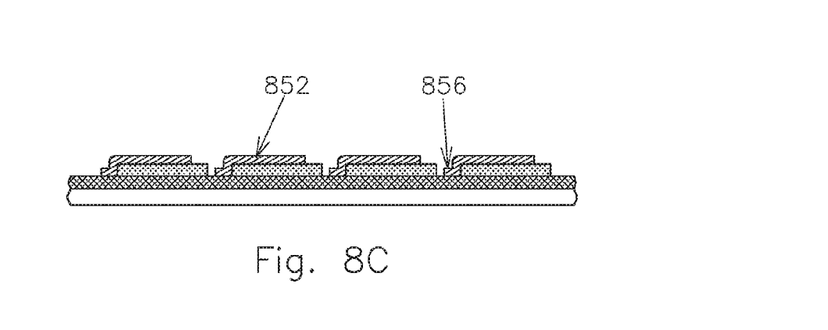

A similar photo-lithography process as described above is then applied to deposit a second electrical insulation layer 851, comprising one or more oxide materials for the best adhesion, mechanical and insulation strength, right on the top of a portion of the first metal layer 611, as shown in FIG. 8A. Note that this second insulation layer 851 is therefore a patterned insulation layer, and comprises many individual insulation patterns. One of them is indicated by 852. For clarity, the shape of the second insulation pattern 852 is separated from the wafer, and shown as 859. The insulation pattern in this example is a simple rectangle, but other second insulation layer shapes are also applicable and are within the scope of this discussion. FIG. 8B is the cross-section view of FIG. 8A cutting through line 8B-8B. One edge 855 of an insulation pattern may physically contact the first insulation layer 311, as a result of the deposition process of the insulation material. The other edge 856 of the second insulation pattern also physically contacts the first insulation layer 311, as indicated in FIG. 8C, which is the other cross-section view of FIG. 5A cutting through line 8C-8C. However, as shown in FIGS. 8A, 8B, and 8C, the extended arms of the first metal layer 611 patterns are left uncovered by the second insulation patterns 852.

Figure 9A:
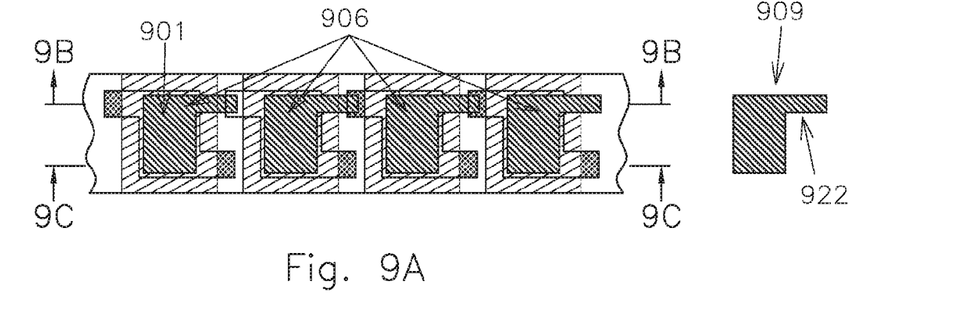
FIGS. 9A through 9C show the top and cross-section views, respectively, of a second patterned metal layer being deposited on top of the second insulation layer.
Figure 9B:
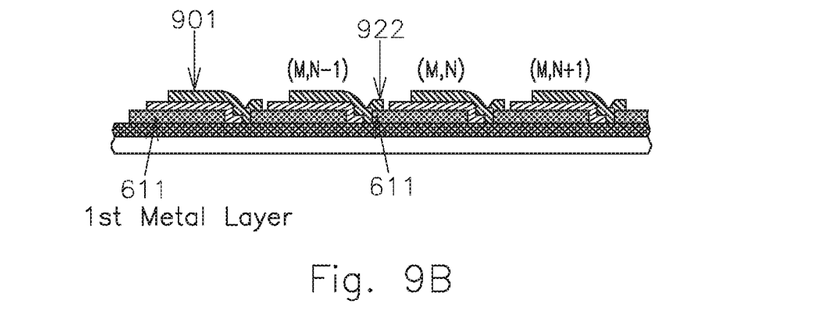
Figure 9C:
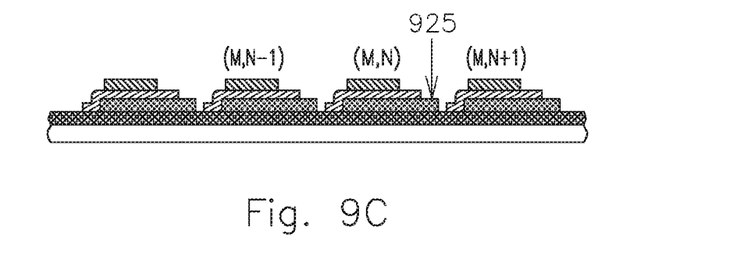

Following another photolithography process, a second metal layer 906, consisting of many individual metal patterns 901, is overlaid on the top of the second insulation layer 851, as shown in FIG. 9A. The individual portions of sections of upper, second metal layer are in a linear arrangement, along which a string of LEDs can be attached. For clarity, the shape of the second metal layer pattern 901 is separated from the wafer, and shown as 909. FIG. 9B is a cross-section view of FIG. 9A, cutting through line 9B-9B. Arm 922 of the second metal layer pattern located at (M, N−1) electrically contacts the metal stripe located at (M, N) of the first metal layer 611. The electrical current from the (M, N−1) metal pattern in the second metal layer therefore flows underneath the (M, N) insulation pattern in the second insulation layer to be adjacent to the next LED chip position (M, N+1) (as will be explained using FIGS. 11A through 11C). FIG. 9C is the other cross-section view of FIG. 9A, cutting through line 9C-9C. One end of a thin metal wire will eventually be bonded at the location indicated by 925, and the other end of this wire will be bonded to the LED chip located at Position (M, N+1). As shown in FIGS. 9A through 9C, arm 922 of the second metal also contacts the substrate (or the insulation layer formed over the substrate). Depending on the thermal conductivity of the materials and other factors, this contact may be useful for heat dissipation, but in other embodiments the arm 922 may be further separated from the substrate by the intermediate insulating layer formed between the metal layers.

Figure 10A:
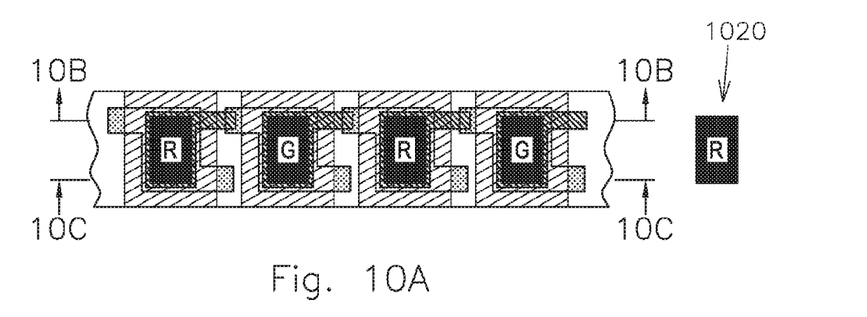
FIGS. 10A through 10C show the top and cross-section views of LED chips of different colors, as they are die-bonded to the second patterned metal layer.
Figure 10B:
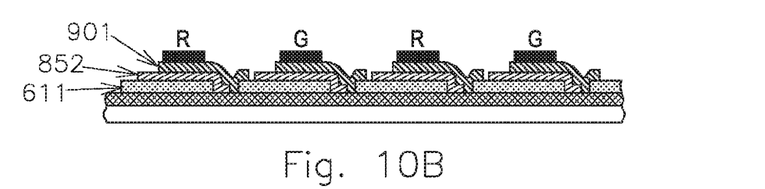
Figure 10C:
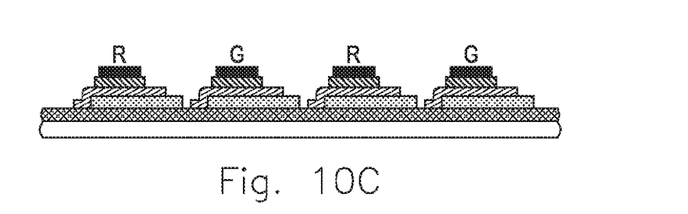

Once the circuit board is formed as described with respect to FIGS. 3-9, the LED chips can be attached. LED chips in different colors (marked R for red and G for green) are then die-bonded onto each of the metal patterns of the second metal layer, as shown in FIG. 10A. For clarity, one LED chip marked R is shown separated from the mounting substrate, as indicated by 1020. Although FIG. 10A only shows part of one row of an LED array, and only shows two colors of LED chips, in the shown arrangement each LED chip is adjacent to LED chips that are of different colors, so that LED chips of the same color are not adjacent to each other. This arrangement enables this attribute over the entire surface of the LED array mounting substrate, with multiple colors of LED chips. FIGS. 10B and 10C are the cross-section views of FIG. 10A, cutting through lines 10B-10B and 10C-10C, respectively. It should be noted that the voltage difference between a metal pattern 611 in the first metal layer and a metal pattern 901 in the second metal layer, separated by a second insulation pattern 852, as shown in FIG. 10B, may be as high as approximately 50 volts. This maximum voltage is a function of how many LED chips are connected together into a string, and may be even higher than 50 volts in some cases, with large LED arrays, and long strings. Therefore, surface protrusions off of the metal patterns and insulation patterns should be eliminated, to prevent electric breakdown across the second insulation layer.

A LED chip has electrical polarity, with a positive electrode (anode) and a negative electrode (cathode). Depending on the fabrication and structure of the LED chip, the two electrodes can be either on opposite sides of the chip (referred to as a vertical type LED structure) or on the same side of the chip (referred to as a horizontal type). In the case of a vertical type LED, the LED can be mounted on top of a corresponding section or portion of the upper metal layer, with a first of its terminals attached. To illustrate the chip being bonded to the mounting substrate, vertical-structure LED chips are used in FIGS. 10A through 10C, and FIGS. 11A through 11C. However, the mounting of horizontal-structure LED chips and other types of electrode configurations are within the scope of the present discussion. For example, for horizontal type LEDs, the LED chips can be mounted beside or adjacent to the corresponding section or portion of the upper metal layer, with a first of its terminals attached to the adjacent section of the pattern second metal layer.

Figure 11A:
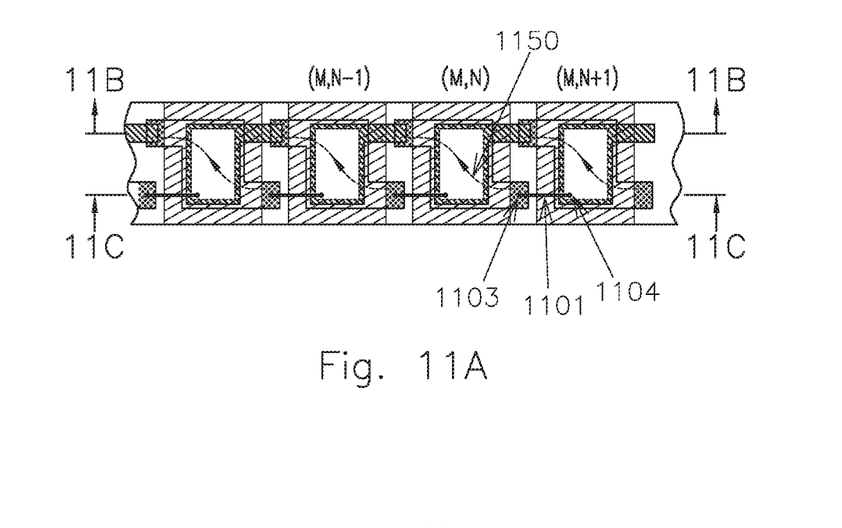
FIGS. 11A through 11C show the top view and cross-section views, respectively, of each of the LED chips being wired to the first metal layer, in order to carry the LED drive current to the underside of the neighboring LED chip.
Figure 11B:
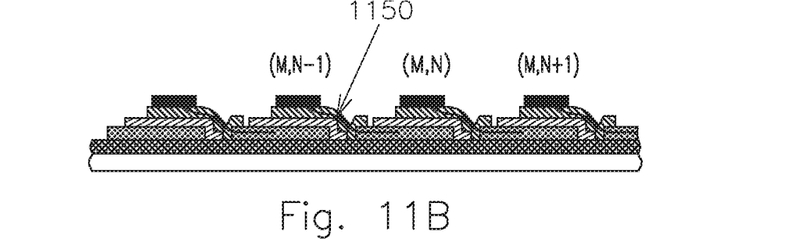
Figure 11C:
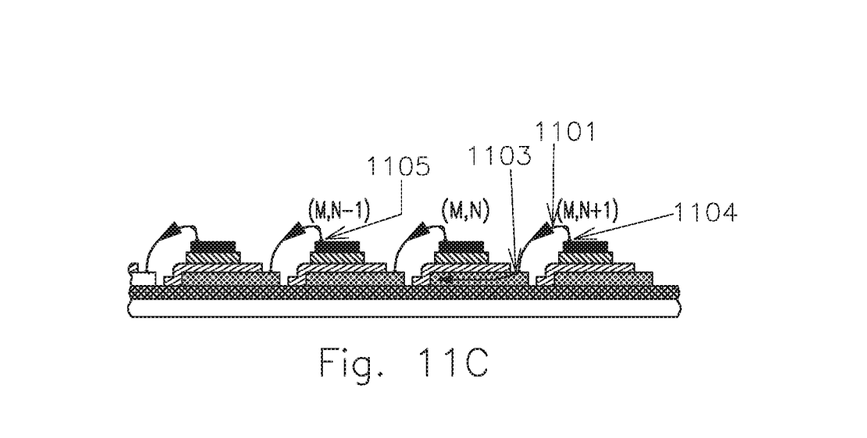

FIGS. 11A through 11C graphically illustrate how current flows from the LED chip at position (M, N−1) to the LED chip at position (M, N+1), while maintaining electrical isolation from the LED chip at position (M, N). One end of an electrical wire 1101 is bonded to the metal stripe at position (M, N) of the first metal layer, at position 1103. The other end of electrical wire 1101 is bonded to the negative electrode (cathode) 1104 of the LED chip at position (M, N+1). The same electrical wiring is applied to all other sites. Current thus flows from the negative electrode of the LED chip at (M, N+1), through the wire 1101, and then passes underneath the insulation pattern at position (M, N), via the buried metal layer at position (M, N), as indicated by dashed line 1150. The current thus flows to the positive electrode (anode) of the LED chip at (M, N−1) and then passes through the p-n junction of LED chip (M, N−1) to its negative electrode (cathode) 1105. (Note that in this example, the positive electrodes (anodes) of the LED chips are the undersides of the LED chips.) Accordingly, as multiple rows of LED chips are put together to become an LED chip array, as illustrated in FIG. 2, a number of LED chips with specifically required emission spectra can be electrically connected in series as a string, such that the current flowing through the LED string can be controlled in order to vary the emission intensity of the entire string. Multiple LED strings can be thus formed, to provide separate strings of differing colors. Typically, a given string will contain LED chips of only one color or wavelength, although other configurations can readily be formed in this way. The described structures allow these LED strings to be formed from non-adjacent LED chips, such that no LED chip in the linear arrangement or string is required to be adjacent to a chip of the same color. In FIGS. 11A through 11C, the connections from the first (lower) metal layer to the second (upper) metal layer are drawn as being from right-to-left, but it will be understood that the arrangement can run in the other direction of the linear arrangement. In either case, the connections should be consistent at each at each such transition to provide the series connection within each set of LEDs.

In other examples, rather than have a the two sets of LED chips alternate, the different sets of LEDs can be interspersed in a more general arrangement with two or more LEDs of the same type in a row. When the next LED along the direction of the string is of the same type, the first of the pair can have its second terminal connected to the portion of the top metal layer corresponding to the next LED chip, so that they are connected in series. The first, lower metal layer under the pair of same-type LED chips will be connected, either by forming a connection between two sections, or by simply forming a single section than runs under all of the adjacent LED chips of the same type, to allow for the series connection of the other set of LEDs. When an adjacent pair of LED chips are then of different types, the upper-lower transition can then be illustrated as in FIGS. 11A through 11C, where a portion of the lower metal of the first of the pair connects to the upper metal of the second (as in FIG. 11B), and the second terminal of the first of the pair along the direction of the string attaches to the lower metal under the second of the pair.

To provide even more flexible wiring routes among and between the LED chips, it is possible, and within the scope of the present discussion, to use more than two insulation layers, and more than two metal layers. For example, a third insulation layer (patterned) and then a third metal layer (also patterned) may be added on top of the second metal layer. Additional metal layers may be beneficial for arrays containing large numbers of LED chips. In the end, the LED chips are then bonded to the metal sites of the third (or top-most) metal layer. The wiring underneath the LED chips is thus a three-dimensional structure. Additional insulation layer and metal layer pairs can be continued. It is also possible to utilize multiple spatially-separate conductive paths, or metal traces, within a conductive physical layer, to further increase routing flexibility when there are more than two groups of LEDs, and for arrays containing large numbers of LED chips, as described more fully below. As long as some of the interconnecting conductive paths and/or metal stripes or traces are beneath LED chip sites, all of these wiring structures are within the scope of the present discussion.

When there are more than two groups of LEDs, whether these are alternated among the groups or use a more general intermixing of chips, N groups will use N metal (or other conducting) layers. Multiple "buried" conducting layers, or paths, are used to pass under intervening chips so that that each of the N groups can be connected in series, independently of the other groups. For example, if the string of chips was a linear arrangement alternating as R, G, B, R, G, B, the circuit board could use one buried conducting layer to pass under the G and B chips, so that the two R chips could be connected, another buried conducting layer passing under the B and R chips to connect the two G chips, and so on. These multiple buried "layers" or paths need not actually be on vertically separate layers, deposited at different times, but, more generally, can be separated laterally, basically running side-by-side on the same plane as horizontally separated, non-connected paths. Referring to FIGS. 10 and 11, these use two cross-section "cut lines" to show how the layers are connected. If the additional buried paths are stacked vertically, as actual additional layers, these could still be shown with just two cut lines; but if the additional buried paths are separated laterally on the same layers, additional cut lines would be needed to show everything in cross-section.

Although the above discussion was in the context where the two (or possibly more) sets of LEDs interspersed along a string are of different colors, the arrangement can be applied whenever there is a desire to have multiple sets of LEDs of any sort connected in series along a linear arrangement and be separately controllable. Further, the described circuit board can be used with other devices having two or more terminals, allowing two or more sets of these devices to be densely packed along a string, with each set being connected in series and separately controllable.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles involved and their practical application, to thereby enable others skilled in the art to best utilize the various embodiments and with various modifications as are suited to the particular use contemplated. It is intended that the scope of the invention be defined by the claims appended hereto.

It is claimed:
1. A method, comprising:
   forming a circuit board, including
      forming a first conductive layer over an insulating surface of a substrate, the first conductive layer having a plurality of separated sections in a linear arrangement;
      forming an intermediate insulating layer over the first conductive layer such that the sections of the first conductive layer have a portion at either end along the linear arrangement that is left uncovered by the intermediate insulating layer; and
      forming a second conductive layer over the first insulating layer, the second conductive layer having a plurality of separated sections each formed over a section of the first conductive layer and separated therefrom by the intermediate insulating layer,
      wherein, when a pair of sections of the second conductive layer adjacent in the linear arrangement are formed over different sections of the first conductive layer, the first of the pair is formed to connect to the uncovered portion of the first conductive layer under the second of the pair, where the first of the pair is the one furthest in a first direction along linear arrangement.
2. The method of claim 1, wherein the substrate is formed of an electrically insulating material.
3. The method of claim 1, wherein the substrate is conductive and forming the circuit board further comprises: prior to forming the first conductive layer, forming a lower insulating layer over the substrate, the first conductive layer being formed over the lower insulating layer.
4. The method of claim 1, wherein the sections of the first conductive layer are formed to have an arm extending over the substrate at either end along the linear arrangement, the arms being the portions left uncovered by the intermediate insulating layer.
5. The method of claim 1, wherein each of the sections of the second conductive layer are formed over a different section of the first conductive layer.
6. The method of claim 1, wherein the linear arrangement is one of a plurality of such linear arrangements forming a two-dimensional array.
7. The method of claim 1, further comprising:
   mounting one of each of a plurality of light emitting diodes (LEDs) over or adjacent to a corresponding section of the second conductive layer with a first terminal thereof connected to the corresponding section of the second conductive layer.
8. The method of 7, wherein the plurality of LEDs are mounted on the corresponding section of the second conductive layer and have a vertical type LED structure.
9. The method of 7, wherein the plurality of LEDs are mounted adjacent to the corresponding section of the second conductive layer and have a horizontal type LED structure.
10. The method of 7, further comprising:
    when a first LED and a second LED are each mounted over or adjacent to one of the corresponding pair of sections of the second conductive layer adjacent in the linear arrangement formed over different sections of the first conductive layer, a second terminal of the LED mounted over or adjacent to the second of the pair is connected to the uncovered portion of the first conductive layer under the first of the pair.
11. The method of claim 10, wherein the plurality of LEDs includes a first set of one or more LEDs of a first type and a second set of one or more LEDs of a second type, and wherein the first and second sets of LEDs are interspersed along the linear arrangement such that the LEDs of each set are connected in series through the first and second conductive layers.
12. The method of claim 11, wherein the first set of LEDs emits a different of color light that the second set of LEDs.
13. The method of claim 11, wherein the LEDs of the first and second sets alternate in the linear arrangement.
14. A method, comprising
    forming a circuit board, including:
       forming one or more first patterned conductive layers over an insulating surface of a substrate;
       forming an upper patterned conductive layer having a plurality of separated portions in a linear arrangement over the substrate, each formed at least partially over a part of one or more of the first patterned conductive layers; and
       forming one or more intermediate insulating layers between the first and upper patterned conductive layers, whereby the first conductive layers are isolated from one another and from the upper conductive layer,
       wherein the patterned layers are formed to provide a plurality of independent current paths whereby a corresponding plurality of distinct sets of one or more devices are connectable in series for each set, with the sets of devices interspersed along the linear arrangement, when a first terminal of each device is connected to a corresponding one of the separated portions of the upper patterned conductive layer and a second terminal of each device is connected to one of the patterned conductive layers, such that the devices of each set are connected in series through the one or more first patterned conductive layers when passing under or adjacent to devices of the other sets that are connected to the corresponding one of the separated portions of the upper patterned conductive layer in the linear arrangement.

15. The method of claim 14, wherein the substrate is formed of an electrically insulating material.

16. The method of claim 14, wherein the substrate is conductive and the method and forming the circuit board further comprises:

prior to forming the first conductive layer, forming a lower insulating layer over the substrate, the first conductive layer being formed over the lower insulating layer.

17. The method of claim 14, wherein the number of distinct sets of devices is greater than two, and wherein at least one of the first patterned conductive layers is formed of a plurality of horizontally separated, non-connected sections.

18. The method of claim 14, wherein the number of first patterned conductive layers is one, the number of distinct sets of devices two, and the devices are connected to the first patterned conductive layer such that the devices of each set are connected in series through the first patterned conductive layer under the devices of the other set.

19. The method of claim 14, wherein the devices of the two sets alternate in the linear arrangement.

20. The method of claim 14, wherein the linear arrangement is one of a plurality of such linear arrangements forming a two-dimensional array.

21. The method of claim 14, wherein the devices are light emitting diodes (LEDs), the method further comprising:

mounting the LEDs over or adjacent to the corresponding section of the second conductive layer with a first terminal thereof connected to the corresponding section of the second conductive layer.

22. The method of 21, wherein the plurality of LEDs are mounted on the corresponding section of the second conductive layer and have a vertical type LED structure.

23. The method of 21, wherein the plurality of LEDs are mounted adjacent to the corresponding section of the second conductive layer and have a horizontal type LED structure.

24. The method of 21, further comprising:

when a first LED and a second LED are each mounted over or adjacent to one of the corresponding pair of sections of the second conductive layer adjacent in the linear arrangement formed over different sections of the first conductive layer, a second terminal of the LED mounted over or adjacent to the second of the pair is connected to the first conductive layer under the first of the pair.

25. The method of claim 24, wherein the plurality of LEDs includes a first set of one or more LEDs of a first type and a second set of one or more LEDs of a second type, and wherein the first and second sets of LEDs are interspersed along the linear arrangement such that the LEDs of each set are connected in series through the first and second conductive layers.

26. The method of claim 25, wherein the first set of LEDs emits a different of color light that the second set of LEDs.

27. The method of claim 25, wherein the LEDs of the first and second sets alternate in the linear arrangement.

28. An array of light emitting diodes (LEDs), comprising:

a plurality of LEDs, each having first and second terminals and being mounted over a substrate having an insulating surface, wherein the plurality of LEDs includes a first set of one or more LEDs and a second set of one or more LEDs, and where the first and second sets of LEDs are distinct and are interspersed in a linear arrangement along the substrate;

a first patterned conductive layer formed over the substrate;

a second patterned conductive layer having a plurality of separated portions formed at least partially over the first patterned conductive layer, wherein each of the plurality of LEDs is mounted over or adjacent to a corresponding portion of the second patterned conductive layer and has a first terminal connected thereto; and an intermediate insulating layer formed between the first and second patterned conductive layers, wherein, when a pair of adjacent LEDs in the linear arrangement are from different ones of the first and second sets, a second terminal of a first of the pair is connected to the first patterned conductive layer under the second of the pair, and the first patterned conductive layer under the first of the pair is connected to the second conductive layer under the second of the pair, where the first of the pair is the one furthest in a first direction along the linear arrangement.

29. The array of LEDs of claim 28, wherein the first set of LEDs emits a different of color light that the second set of LEDs.

30. The array of LEDs of claim 28, wherein the LEDs of the first and second sets alternate in the linear arrangement.

31. The array of LEDs of claim 28, wherein the array is a two-dimensional array formed of a plurality of linear arrangements of LEDs, one of which is the linear arrangement formed by the plurality of LEDs.

32. The array of LEDs of claim 28, wherein the substrate is formed of an electrically insulating material.

33. The array of LEDs of claim 28, wherein the substrate is conductive and the array further includes a lower insulating layer formed over the substrate, over which the first patterned conductive layer is formed.

34. The array of LEDs of claim 28, wherein the plurality of LEDs are mounted on the corresponding portion of the second patterned conductive layer and have a vertical type LED structure.

35. The array of LEDs of claim 28, wherein the plurality of LEDs are mounted adjacent to the corresponding portion of the second patterned conductive layer and have a horizontal type LED structure.

36. The array of LEDs of claim 28, wherein each of the plurality of LEDs is die-bonded to the corresponding portion of the second patterned conductive layer.

37. An array of light emitting diodes (LEDs), comprising:

a circuit board, including:

a substrate having an insulating surface;

one or more first patterned conductive layers formed over the insulating surface of the substrate;

an upper patterned conductive layer having a plurality of separated portions arranged in a linear arrangement over the substrate, each of the of separated portions being formed at least partially over a part of one or more of the first patterned conductive layers; and one or more intermediate insulating layers formed between the first and upper patterned conductive layers, whereby the first conductive layers are isolated from one another and from the upper conductive layer, and a plurality of LEDs, including a plurality of distinct sets of one or more LEDs, each of the LEDs having first and second terminals and each being mounted over or adjacent to a corresponding one of the separated portions of the upper patterned conductive layer with a first terminal connected thereto, such that the sets of LEDs are interspersed along the linear arrangement, wherein the second terminals of each of the LEDs are connected to one of the patterned conductive layers such that the LEDs of each set are connected in series through the one or more first patterned conductive layers when passing under or adjacent to LEDs of the other sets that are connected to the corresponding one of the separated portions of the upper patterned conductive layer in the linear arrangement.

38. The array of LEDs of claim 37, wherein the number of distinct sets of one or more LEDs is greater than two, and
wherein at least one of the first patterned conductive layers includes a plurality of horizontally separated, non-connected sections.

39. The array of LEDs of claim 37, wherein each of the sets of LEDs emits a different of color light.

40. The array of LEDs of claim 37, wherein the array is a two-dimensional array formed of a plurality of linear arrangements of LEDs, one of which is the linear arrangement formed by the plurality of LEDs.

41. The array of LEDs of claim 37, wherein the substrate is formed of an electrically insulating material.

42. The array of LEDs of claim 37, wherein the substrate is conductive and the circuit board further includes a lower insulating layer formed over the substrate, over which the first patterned conductive layers are formed.

43. The array of LEDs of claim 37, wherein the plurality of LEDs are mounted on the corresponding portion of the upper patterned conductive layer and have a vertical type LED structure.

44. The array of LEDs of claim 37, wherein the plurality of LEDs are mounted adjacent to the corresponding portion of the upper patterned conductive layer and have a horizontal type LED structure.

45. The array of LEDs of claim 37, wherein each of the plurality of LEDs is die-bonded to the corresponding portion of the upper patterned conductive layer.

46. The array of LEDs of claim 37, wherein the number of first patterned conductive layers is one, the number of distinct sets of LEDs is two, and the LEDs are connected to the first patterned conductive layer such that the LEDs of each set are connected in series through the first patterned conductive layer under the LEDs of the other set.

47. The array of LEDs of claim 46, wherein the LEDs of the two sets alternate in the linear arrangement.

* * * * *